United States Patent [19]
Steere

[11] Patent Number: 6,055,694
[45] Date of Patent: May 2, 2000

[54] WAFER SCRUBBING MACHINE

[75] Inventor: Colby R. Steere, Parsippany, N.J.

[73] Assignee: TSK America, Inc., Oakland, N.J.

[21] Appl. No.: 09/201,291

[22] Filed: Nov. 30, 1998

[51] Int. Cl.[7] .......................... A46B 13/00; B65G 49/07
[52] U.S. Cl. ................ 15/77; 15/21.1; 414/938
[58] Field of Search ............................ 15/21.1, 77, 88.2, 15/88.3, 88.4, 102; 414/937, 938, 940, 941

[56] References Cited

U.S. PATENT DOCUMENTS

| | | | |
|---|---|---|---|
| 4,138,755 | 2/1979 | Hashimoto et al. | 15/77 |
| 4,202,071 | 5/1980 | Scharpf | 15/88.4 |
| 4,208,760 | 6/1980 | Dexter et al. | 15/88.4 |
| 5,092,011 | 3/1992 | Gommori et al. | 15/88.2 |

FOREIGN PATENT DOCUMENTS

| | | |
|---|---|---|
| 2626261 | 7/1989 | France . |
| 1-230245 | 9/1989 | Japan . |
| 6-97262 | 4/1994 | Japan . |

*Primary Examiner*—Robert J. Warden, Sr.
*Assistant Examiner*—Andrew Aldag
*Attorney, Agent, or Firm*—McAulay Nissen Goldberg Kiel & Hand, LLP

[57] ABSTRACT

A wafer scrubbing machine is provided with a network of wafer holders which can be moved from a retracted position adjacent each other at a wafer receiving station to an expanded position spaced apart from each within a scrubbing station. The wafers are picked up simultaneously by pairs of depending arms in the scrubbing station and passed between pairs of rotating brushes for cleaning purposes. A common drive wheel is provided to rotate the wafers simultaneously during scrubbing between the brushes. A second network of wafer holders is provided to receive the scrubbed wafers in the scrubbing station and to move into a retracted position within a delivery station for transfer of the cleaned wafers into a cassette for subsequent processing. Two sets of networks may be provided on a common rotatable assembly in order to accommodate two different sizes of delivered wafers.

23 Claims, 11 Drawing Sheets

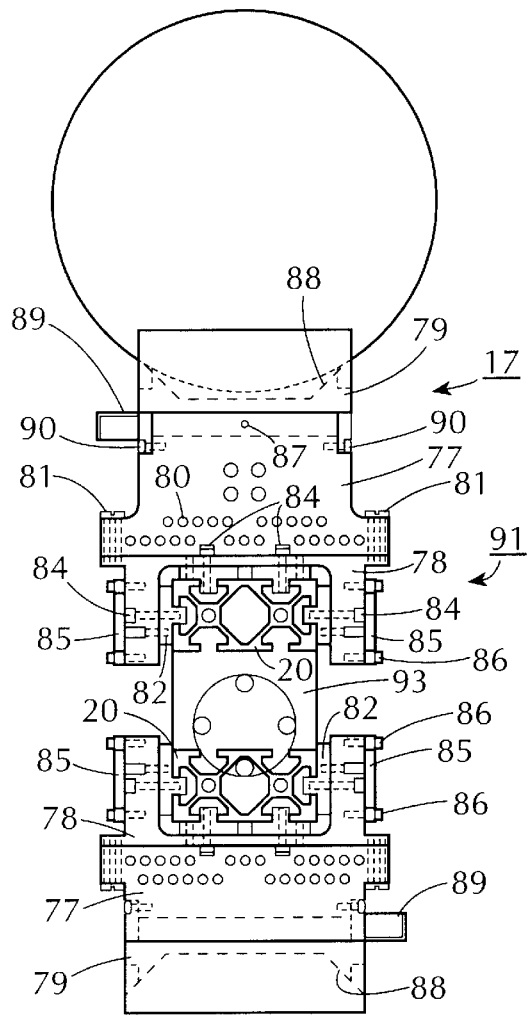
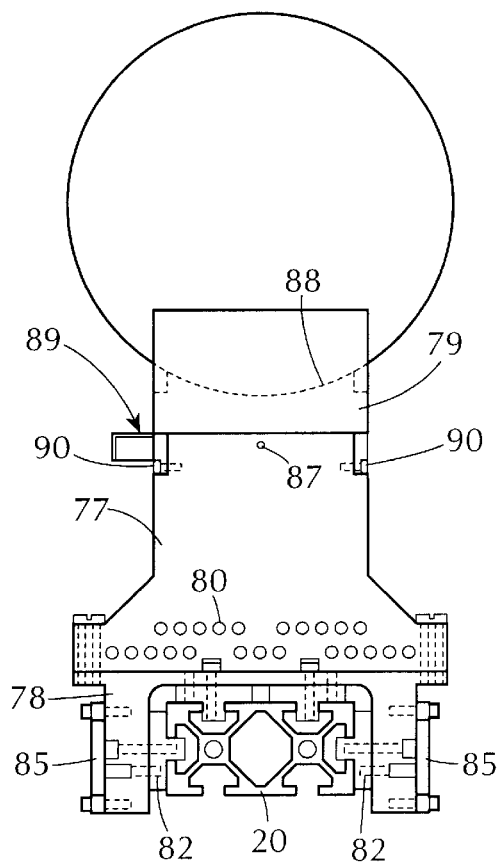
FIG. 9
FIG. 10

WAFER SCRUBBING MACHINE

This invention relates to a wafer scrubbing machine.

Heretofore, ingots of silicon and other materials have been sliced in order to provide wafers which can be further processed for the semi-conductor industry. In some cases, the wafers have been sliced one-by-one from an ingot and placed into cassettes for subsequent processing. In other cases, wire saws have been employed to cut a plurality of wafers from a single ingot with the wafers thereafter being separated from a mounting block of the ingot and delivered into cassettes. In either case, the wafers which are disposed in the cassettes have generally required washing in order to remove debris from the surfaces of the wafers.

Scrubbing machines have also been known which are able to wash a series of wafers delivered in a cassette. For example, one known disc cleaning system employs a vertically disposed arm which is able to lift a wafer vertically out of a delivered cassette and to pass the wafer between an overlying pair of counter-rotating brushes for cleaning of the opposite surfaces of the wafer. The machine also has a pair of drive wheels above the brushes which engage the peripheral edge of the wafer in order to rotate the wafer while located between the brushes. During operation, as the wafer rotates, the opposite surfaces of the wafer are scrubbed across the wafer center-line. After scrubbing, the vertical support arm is retracted so as to return the wafer to the cassette. Thereafter, the next wafer in line in the cassette is lifted, rotated, scrubbed and returned to the cassette.

Generally speaking, the wafer scrubbing machines which have been previously employed have a limited wafer throughput.

Accordingly, it is an object of the invention to increase the wafer throughput through a wafer scrubbing machine.

It is another object of the invention to provide a wafer scrubbing machine which has a reduced floor area footprint.

It is another object of the invention to be able to wash and scrub all of the wafers of a handling cassette simultaneously.

Briefly, the invention provides a wafer scrubbing machine which includes a wafer holder network including a plurality of holders, each of which is disposed to receive a wafer in a vertically upstanding manner, a plurality of parallel rotatably mounted brushes and a transfer conveyor for simultaneously moving a plurality of wafers from the holders into and between the brushes for scrubbing of each wafer between a pair of adjacent brushes.

In accordance with the invention, the wafer holder network also includes an actuator system for moving the holders relative to each other between a retracted position with the holders adjacent each other and an expanded position with the holders in spaced apart relation to each other and below the brushes. The transfer conveyor serves to transfer the wafers from the expanded position of the holders upwardly into and between the brushes.

The scrubbing machine may also be provided with a second wafer holding network of similar construction to the first wafer holding network in order to receive a plurality of scrubbed wafers from the transfer conveyor and to thereafter move from an expanded position beneath the brushes to a retracted position with the holders adjacent to each other.

The scrubbing machine also has a receiving station for receiving a cassette of wafers and for transferring the wafers in the cassette into the holders of the first holder network as well as a delivery station adjacent to the retracted position of the second holder network to transfer the scrubbed wafers into a cassette.

The transfer conveyor which is used for simultaneously moving the wafers into and between the brushes for cleaning purposes includes a plurality of pairs of depending arms which are positioned for movement between a respective pair of brushes. Each arm carries a guide on a lower end for engaging a peripheral edge of a wafer and a rotatable wheel which is mounted intermediately of the arm in a spring-loaded pivotal manner for engaging the peripheral edge of a wafer. In addition, the transfer conveyor has a lifting unit for raising and lowering the arms simultaneously and a spreader assembly for moving the arms of each pair of arms relative to each other in order to selectively engage the guide and rotatable wheel of each arm with a respective wafer.

The transfer conveyor also includes a means for rotating all of the engaged wafers simultaneously in order to effect rotation of the wafers during passage of the wafers between the brushes.

The scrubbing machine is also provided with a catch basin below the brushes in order to receive cleaning fluid and waste which is scrubbed from the wafers.

During operation, a cassette of wafers is delivered to the receiving station of the scrubbing machine and the wafers transferred from the cassette into the holders of the wafer holder network at the receiving station. The holders are then moved into a spaced apart position below the scrubbing brushes. Thereafter, the transfer conveyor is deployed to engage and lift the wafers from the holders upwardly into and between the rotating brushes in order to effect cleaning of the opposite surfaces of each wafer.

After a suitable time has elapsed for cleaning purposes, the pairs of arms are lowered downwardly. By this time, the holders of the first holder network have been retracted and the holders of the second holder network expanded into position below the now descending wafers. The wafers are then received in the holders of the second network and then moved into the retracted position of this holder network at the delivery station. The scrubbed wafers are then delivered into a cassette at the delivery station and transported away for further processing.

The machine may be constructed to accommodate different sizes of wafers. That is to say, the machine may be adapted to receive a cassette of, for example, 8 inch diameter wafers or a cassette of larger wafers such as 12 inch diameter wafers. To this end, the machine employs a rotatable assembly which carries two sets of wafer holder networks, one to receive a small size wafer and the other to receive a larger size wafer. Depending upon the wafers being processed, the assembly is rotated into the appropriate position to receive the smaller or larger wafers.

The rotatable assembly comprises a pair of longitudinal parallel rails which are disposed in parallel to and about a common longitudinal axis of rotation and means for rotating the rails about the axis of rotation. In addition, a pair of wafer holder networks is mounted on each rail with each network being disposed on an opposite end of the respective rail from the other of the pair of networks. As above, each network includes a plurality of holders to receive wafers and means for moving the holders relative to each other between a retracted first position with the holders adjacent each other and an expanded second position with the holders in spaced apart relation to each other.

The rotatable assembly can be separately mounted within the machine so that the assembly can be replaced from time to time depending upon the size of wafers being processed.

By way of example, where the machine is used to receive and scrub cassettes of 8 inch wafers, the wafer holder network assembly is rotated into a position so that the holders of the networks for receiving the smaller wafers are in an upstanding position. At this time, the second set of wafer holder networks are in a dependent position 180° out of phase with the first pair of holder networks.

Should a cassette be delivered to the scrubbing machine with wafers of a larger size, for example 12 inches, the network assembly is adjusted so that the set of wafer holder networks for receiving the larger diameter wafers is rotated into the upstanding position while the other set of networks is rotated into the dependent position. The larger wafers are then received and processed in a similar fashion as described above.

The wafer holder network assembly thus allows the scrubbing machine to receive two different sized wafers without any need to tear down and reconstruct the machine or otherwise replace parts in the machine to adapt to the differently sized wafers.

The actuator system for moving the wafer holders may also be constructed to move not only the holders of the wafer holder network for delivering wafers to the transfer conveyor, i.e. the "send" holder network but also the holders of the wafer holder network for delivering the scrubbed wafers from the transfer conveyor, i.e. the "receive" holder network. In this respect, the actuator system employs an endless cable, a bracket secured to and between the cable and a foremost one of the holders of a network and a pneumatic actuator connected to the cable for driving the cable in order to effect movement of the bracket and, thus, the foremost holder of the network between the retracted and expanded positions of the holders in the network. The actuator system would employ a duplicate set of elements for driving the holders of the "receive" holder network.

The actuator system for moving the wafer holders may also be constructed to move not only the holders of the wafer holder network for delivering wafers to the transfer conveyor, i.e. the "send" holder network but also the holders of the wafer holder network for delivering the scrubbed wafers from the transfer conveyor, i.e. the "receive" holder network. In this respect, the actuator system employs an endless cable, a bracket secured to and between the cable and a foremost one of the holders of a network and a pneumatic actuator connected to the cable for driving the cable in order to effect movement of the bracket and, thus, the foremost holder of the network between the retracted and expanded positions of the holders in the network. The actuator system would employ a duplicate set of elements for driving the holders of the "receive" holder network.

These and other objects and advantages of the invention will become more apparent from the following detailed description taken in conjunction with the accompanying drawings wherein:

FIG. 9 illustrates an end view of the rotatable assembly of FIG. 8;

FIG. 10 illustrates an end view of a modified holder for a single set of wafer holder networks in accordance with the invention;

Figure 1:
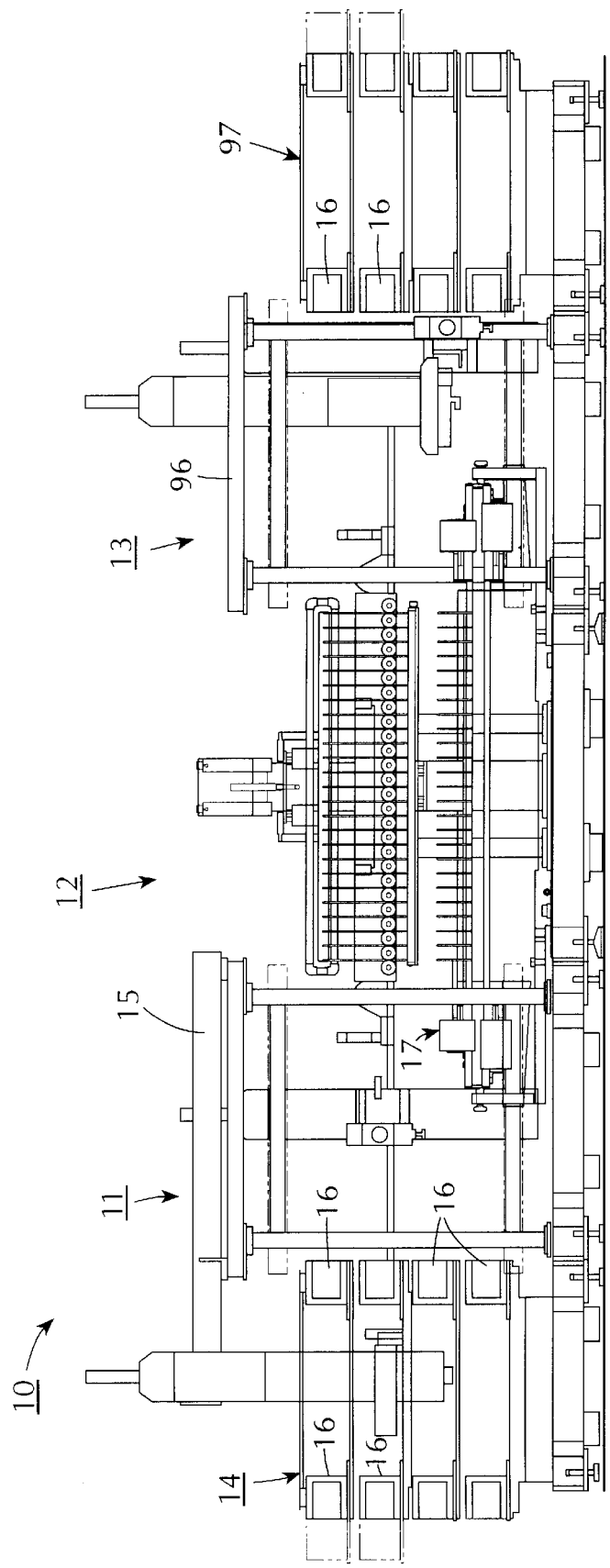
FIG. 1 illustrates a schematic view of a wafer scrubbing machine constructed in accordance with the invention.

Referring to FIG. 1, the wafer scrubbing machine 10 includes a receiving station 11, a scrubbing station 12 and a delivery station 13.

The receiving station 11 is disposed at one end of the machine 10 and includes a carousel module 14 and a wafer transfer module 15. The carousel module 14 has tiers of peripheral openings to accommodate four or more annular rows of wafer holding cassettes 16, for example, wafers having a diameter of 6 inches. The wafer transfer module 15 serves to transfer a plurality of wafers from a cassette 16 of the carousel module 14 to the scrubbing station 12. In this respect, the wafer transfer module 15 moves the wafers from horizontal planes into vertical planes for delivery into the scrubbing station 12. The details of the carousel module 14 and wafer transfer module 15 are not required for an understanding of the scrubbing station 12 as any suitable means or mechanism may be used to deliver wafers to the scrubbing station 12.

Figure 2:
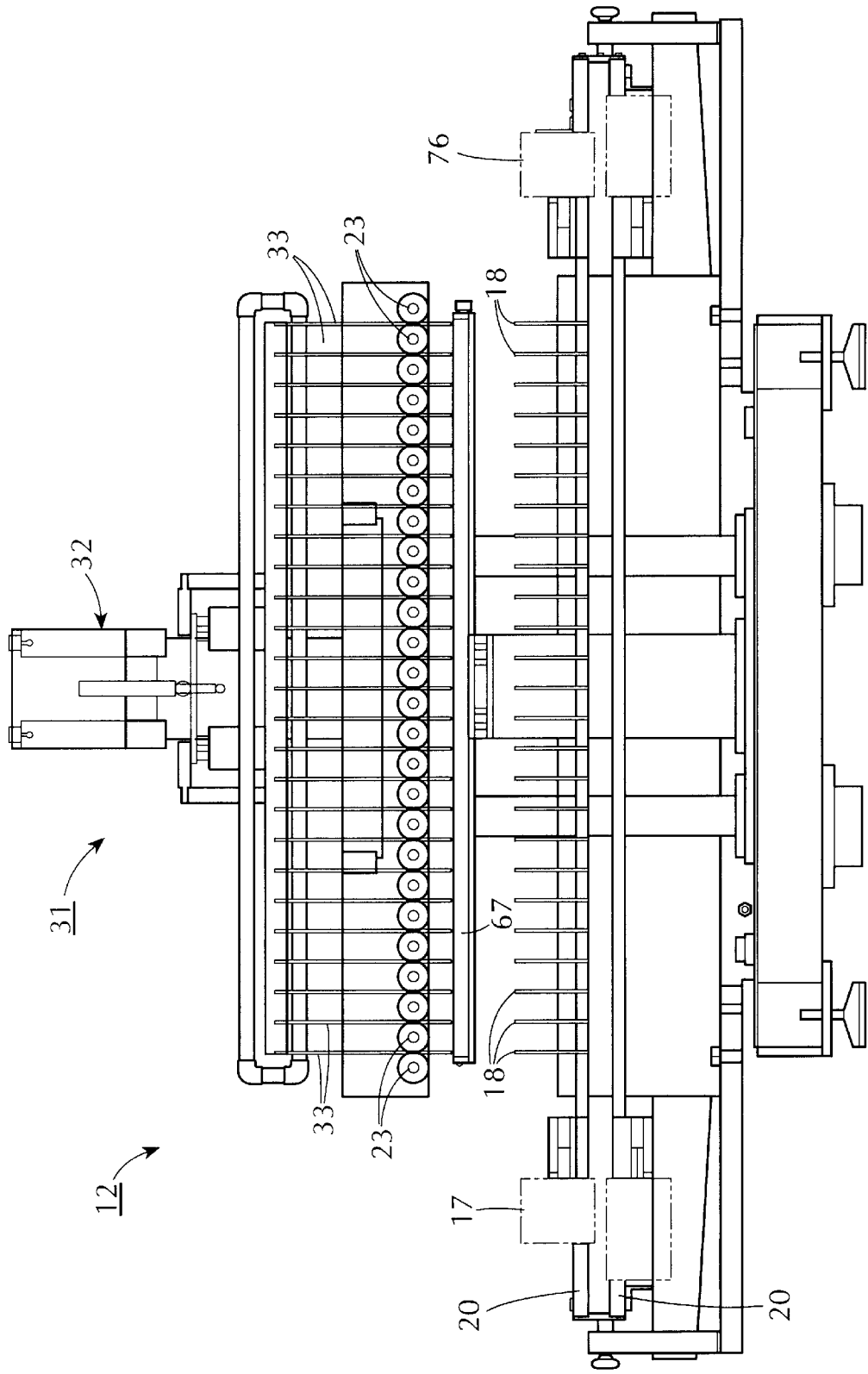
FIG. 2 illustrates a view of the scrubbing station of the machine of FIG. 1.

Referring to FIG. 2, the scrubbing station 12 has a wafer holder network 17 which is formed of a plurality of holders 18, each of which is disposed to receive a wafer 19 in a vertically upstanding manner.

Figure 5:
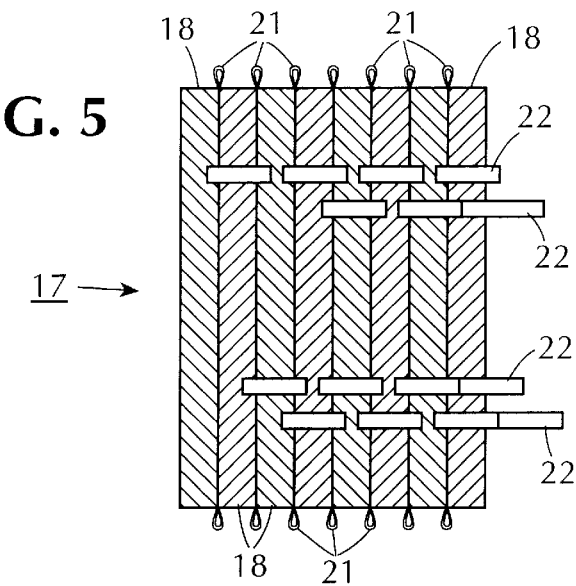
FIG. 5 illustrates the holders of a wafer holder network in a retracted position in accordance with the invention.
Figure 6:
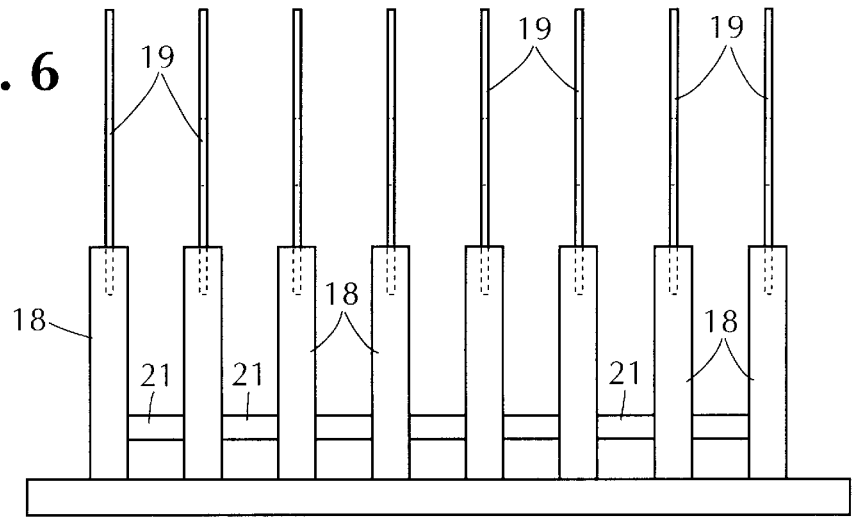
FIG. 6 illustrates a side view of the holders of FIG. 5 in an expanded position in accordance with the invention.
Figure 7:
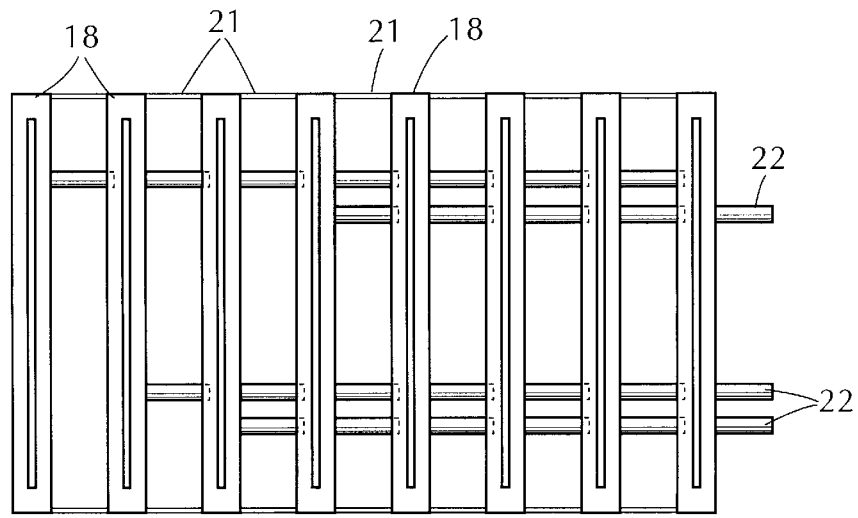
FIG. 7 illustrates a plan view of the holders of FIG. 6.

Referring to FIG. 5, the holders 18 are slidably mounted on a rail 20 (see FIG. 9) which extends across the scrubbing station 12. In addition, the wafer holder network 17 includes means for moving (not shown) the holders 18 along the rail 20 relative to each other between a retracted first position as shown in FIG. 5 and an expanded second position with the holders 18 in spaced apart relation to each other as shown in FIG. 6. To this end, this means includes a lead screw or pneumatic piston (not shown) connected to a foremost holder 18' for moving this holder 18' between the retracted and expanded positions of the holders 18. In addition, a pair of longitudinally collapsible links 21 are connected to and between each pair of adjacent holders 18 these links 21 serve to transfer a forward motion between the holders 18. A plurality of outrigger guide pins 22 (see FIG. 7) are provided for guiding and keeping the holders 18 vertical while moving between the retracted and expanded positions. As indicated in FIG. 7, each guide pin 22 is secured to a selected one of the holders 18 and passes through a plurality of other holders 18 via slotted guide holes therein for guiding the holders 18 in a vertical disposition while moving to the retracted position (FIG. 5) or the expanded position (FIGS. 6 and 7). Typically, each pin 22 is sized of a length to pass through fourteen holders when in the retracted position shown in FIG. 5.

The wafer holders 18 are disposed on a pitch in the retracted position which varies with the wafer diameter. Typically, for a 6 inch wafer, the pitch is 0.1875 inches, for an 8 inch wafer, the pitch is 0.250 inches and for a 300 millimeter wafer, the pitch is 10 millimeters. Each pin 22 extends 3.25 inches forward of the holder 18 to which the pin 20 is secured.

Figure 3:
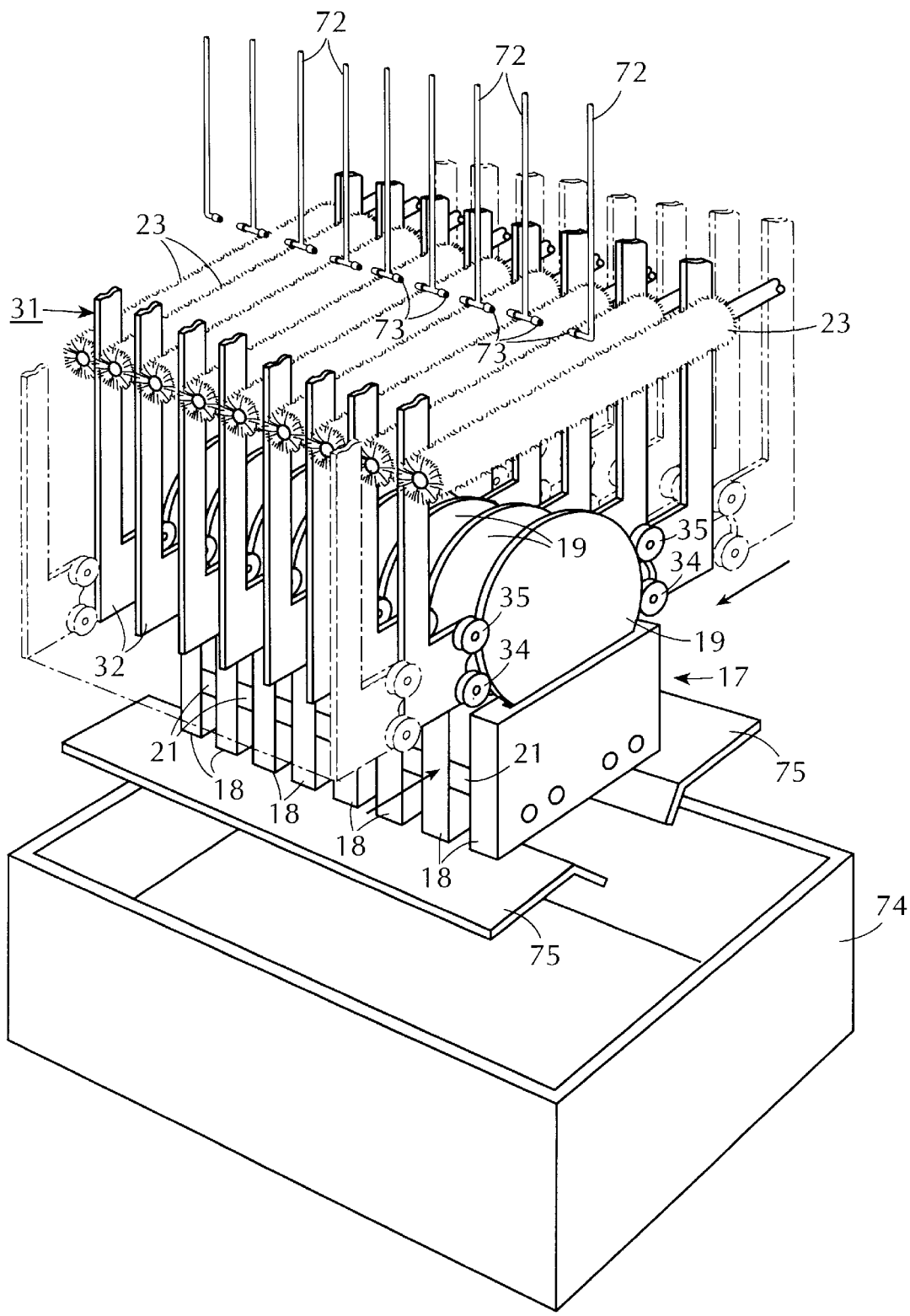
FIG. 3 illustrates a schematic perspective view of the scrubbing station of a wafer scrubbing machine constructed in accordance with the invention with the holders of a holder network in an expanded position.

Referring to FIG. 3, the scrubbing station 12 also includes a plurality of parallel rotatably mounted brushes 23. Each brush 23 is of a diameter of 3.0 inches and is made of bristles, such as white Nylon, which are suited to cleaning the surfaces of a wafer 19.

The brushes 23 are driven by a suitable means (not shown) so that the brushes 23 all rotate in the same direction, for example clockwise. The brushes 23 can also be driven in an alternating manner so that one brush rotates clockwise and the next brush rotates counterclockwise. This would require a second group of pulleys and timing belts.

Figure 11:
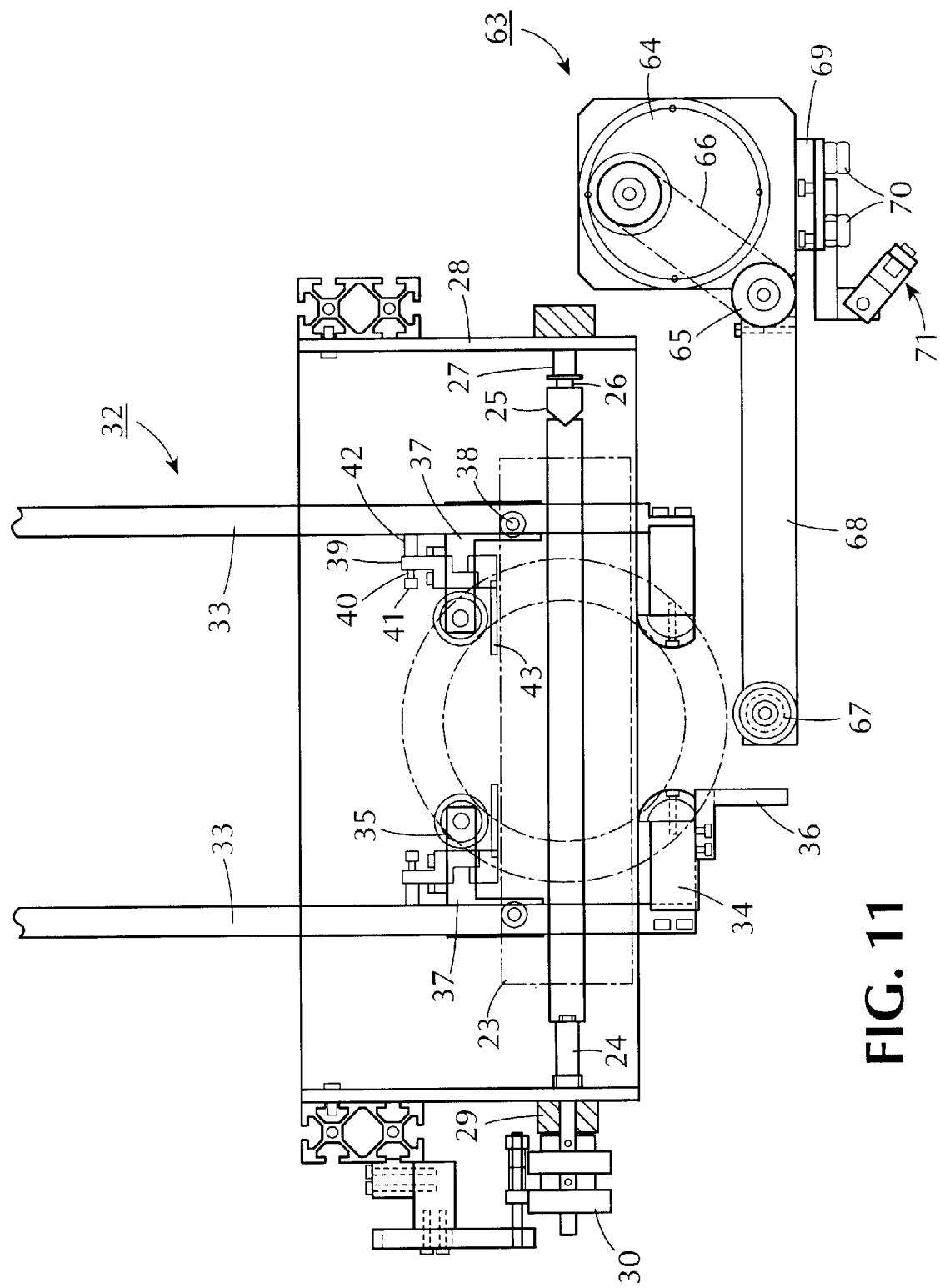
FIG. 11 illustrates a detailed view of a pair of arms of the scrubbing station constructed in accordance with the invention.

Referring to FIG. 11, each brush 23 is removably mounted within the machine 10 for ease of replacement. As indicated, one end of a brush 23 is connected by a socket arrangement to a rotatable shaft 24 while the opposite end is received on a conically shaped roller 25 which is rotatably mounted on a non-rotatable stub shaft 26 which is biased by a spring 27 in a direction towards the brush 23. The rotatable drive shaft 24 is mounted within a frame 28 which is fixed within the machine frame via a bearing 29. The stub shaft 24 is resiliently biased by the spring 27 to move relative to the frame 28 so as to hold the brush 23 in place during rotation and to allow removal of the brush 23 by moving the brush 23 against the bias of the spring 27 to disconnect the brush 23 from the rotatable shaft 24 and then from the roller 25.

A motor 30 is mounted on the frame 28 to drive the shaft 24 and, thus, the brush 23. Typically, a single motor 30 is used to rotate all the brushes via a suitable transmission of pulleys and timing belts (not shown).

As shown in FIG. 3, a transfer conveyor 31 is provided in the scrubbing station 12 for simultaneously engaging a plurality of wafers 19 in the holders 18 when in the expanded position thereof as shown in order to move the wafers 19 vertically between the brushes 23 for scrubbing of each wafer 19 between a pair of adjacent brushes 23, as illustrated in FIG. 3.

Figure 12:
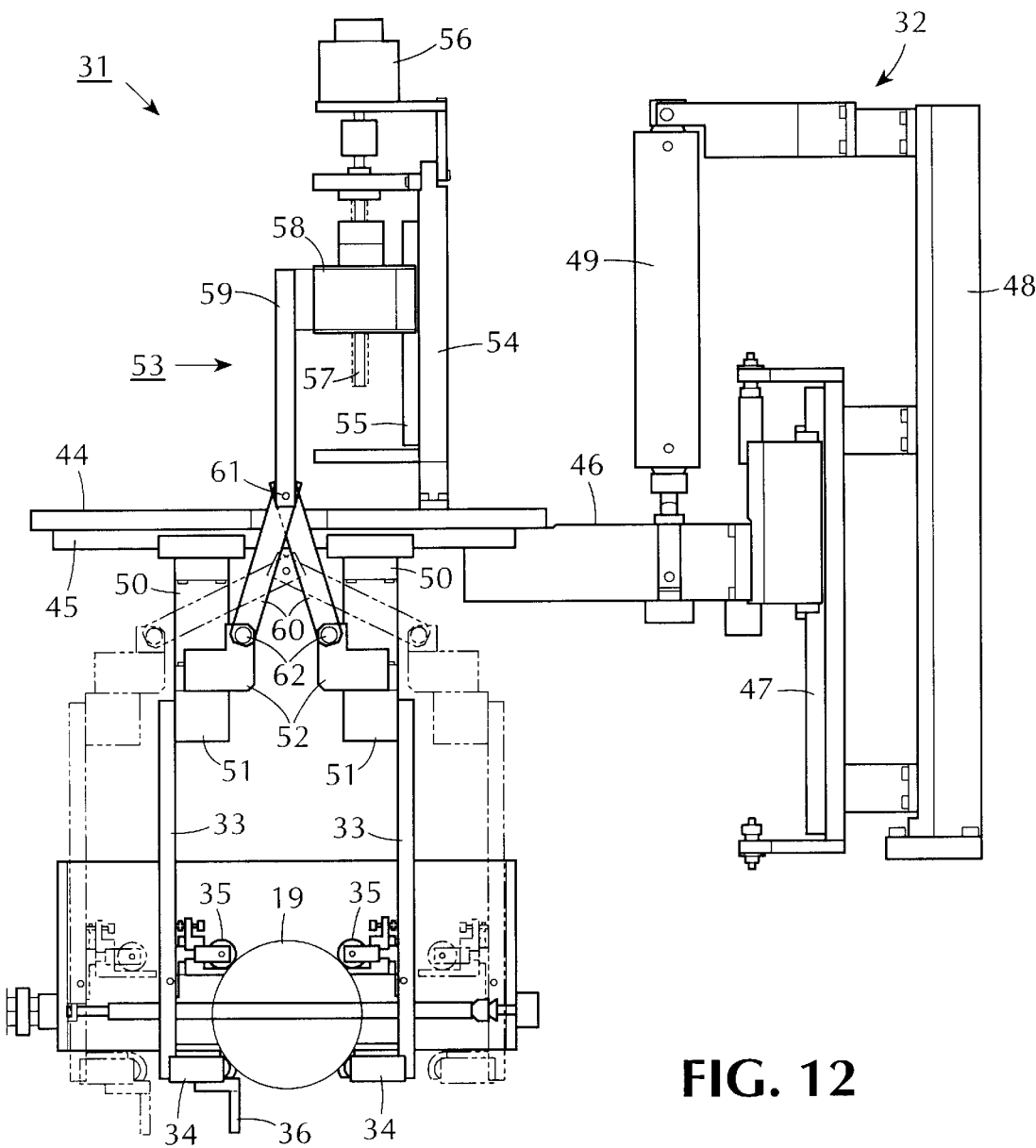
FIG. 12 illustrates a view of the transfer conveyor for manipulating the pairs of arms of the scrubbing station.

Referring to FIG. 12, the transfer conveyor 31 includes a lifting unit 32 having a plurality of pairs of depending arms 33 for engaging a wafer 19 between each pair of arms 33.

Referring to FIG. 11, each arm 33 carries a fixed guide 34 on the lower end for engaging a peripheral edge of a wafer 19 as well as a rotatable wheel 35 which is mounted intermediately of the arm 33 for engaging the peripheral edge of a wafer 19. The transfer conveyor 31 is constructed to move the arms 33 simultaneously laterally and vertically in a uniform manner. That is to say, each arm 33 is moved horizontally toward the wafer centerline when engaging the wafers in order to selectively engage the guide 34 and wheel 35 on each arm 33 with a wafer 19. Similarly, the depending arms 33 all move away from the wafers when releasing or disengaging the wafers.

Each guide 34 is a fixed member which has an arcuate groove (not shown) in a surface facing the edge of a wafer and a pair of rounded surfaces which extend away from the groove in order to guide the peripheral edge of a wafer into the groove should the arms 33 be out of exact alignment with a wafer 19.

A depending L-shaped guide piece 36 is secured to the underside of one of the guides 34 to ensure correct alignment when a wafer is being released or disengaged into a wafer holder 10. This depending guide piece 36 includes a chamfered groove (not shown) for receiving a projection on a wafer holder 18 as described below. The projection will slide within the groove to correct any small misalignment between the depending arms 33 and the receiving holders 18.

Each wheel 35 is freely rotatable and is carried on an L-shaped bracket 37 which is pivotally mounted on a pivot pin 38 which is fixed within the arm 33. As indicated, the bracket 37 fits within a slot (not shown) within the arm 33 so as to maintain the wheel 35 and the fixed guide 34 in vertical alignment with each other.

The wheel 35 has a V-shaped groove which is aligned with the groove in the fixed guide 34 so as to receive a wafer 19 in a truly vertical position.

Each L-shaped bracket 37 carries an upstanding bifurcated member 39 which cooperates with a pin 40 which is threaded into an arm 33 and passes through the bifurcations of the member 39. The pin 40 carries a head 41 which is sized to abut against the member 39. A washer (not shown) is also provided between the head 41 of the pin 40 and the bifurcated member 39. The head 41 of the pin 40 is also provided with a socket (not shown) to receive a wrench, such as an Allen wrench in order to permit threading of the pin 40 more or less into the arm 33 so as to adjust the position of the wheel 35 from time to time. In addition, a spring 42 is provided about the pin 40 between the bifurcated member 39 and the arm 33 so as to bias the member 39 outwardly and thus the rotatable wheel 35 toward a wafer 19.

The bracket 37 also carries a bifurcated guide 43, for example of plastic material, below the plane of the wheel 35. This bifurcated guide 43 serves to guide a wafer 19 relative to the wheel 35 and prevents tilting of the wafer 19 away from the wheel 35. To this end, the ends of the bifurcations of the guide 43 are chamfered inwardly to guide a wafer towards the wheel 35.

Referring to FIG. 11, the purpose of the fixed guides 43 is to correct for any small misalignment between the depending arms 33 and the wafers 19 when the depending arms 33 engage the wafers 19 before lifting the wafers into contact with the brushes 23 (see FIG. 3).

Referring to FIG. 12, the lifting unit 32 includes a support platform 44 which carries a track 45 on the underside and which is connected to a bracket 46 which is slidably mounted to ride on a fixed track 47 secured in suitable fashion to a fixed vertical support 48 of the machine. As illustrated, the fixed support 48 carries a piston and cylinder arrangement 49 which functions to raise and lower the bracket 46 along the track 47. In this regard, the piston and cylinder arrangement 49 is pneumatically actuated (or hydraulically actuated) by suitable means (not shown) to raise and lower the bracket 46 and, thus, the platform 44.

As illustrated, a pair of slider units 50 are slidably mounted on the track 45 on the underside of the platform 44. Each slider unit 50 carries a horizontal beam 51 which extends transversely across the width of the scrubbing station and to which the arms 33 are secured in depending manner. Each beam 51 also carries a bracket 52 for purposes as described below.

As shown in FIG. 12, the transfer conveyor 31 also includes a spreader assembly 53 which is mounted on the support platform 44 to move therewith. The spreader assembly 53 includes a vertical support 54 which is secured to the support platform 44 and which carries a vertical track 55 along one side. A motor 56 is mounted on the vertical support 54 to drive a threaded lead screw 57 which extends downwardly and parallel to the track 55. An internally threaded housing 58 is slidably mounted on the track 55 and threaded into engagement with the lead screw 57 so that upon rotation of the lead screw 57, the housing 58 is moved vertically along the track 55.

The housing 58 carries a vertically disposed member 59 which, in turn, carries a pair of links 60 each of which is pivotally connected via a pin 61 on the lower end of the vertical member 59. Each link 60 is also pivotally connected via a pin 62 to a bracket 52 on a beam 51 which supports a plurality of arms 33.

The motor 56, lead screw 57, housing 58 and track 55 serve as a means for raising and lowering the vertical member 59 relative to the platform 44 to effect movement of the links 60 towards each other to close the arms 33 towards each other in response to raising of the vertical member 59 and to effect movement or the links 60 away from each other to open the arms 33 of each pair of arms away from each other in response to lowering of the vertical member 59.

Referring to FIG. 3, when in use, the arms 33 of the lifting unit 32 project downwardly through and between a respective pair of brushes 23. The lifting unit 32 serves for raising and lowering the arms 33 between a lowered position as shown in FIG. 2 and a raised position as shown in FIG. 3. In the lowered position, the arms 33 are positioned so that the fixed guides 34 are below the center of a wafer 19 in a holder 18 while the wheels 35 are above the center of the wafer 19. The arms 33 are then brought together by the spreader assembly 53 so that the guides 34 and wheels 35 engage the periphery of the wafer 19.

The spring-biased wheels 35 have enough motion to compensate for a flat or notch in the wafer geometry. In this respect, the wheels 35 are maintained in constant contact with the wafer edge while the wafer is engaged. Of note, the only variable related to the size of the wafers being processed is the distance the arms 33 are to travel inwardly toward a wafer. That is to say, no changes are made to the springs 42 when changing wafer size.

Figure 4:
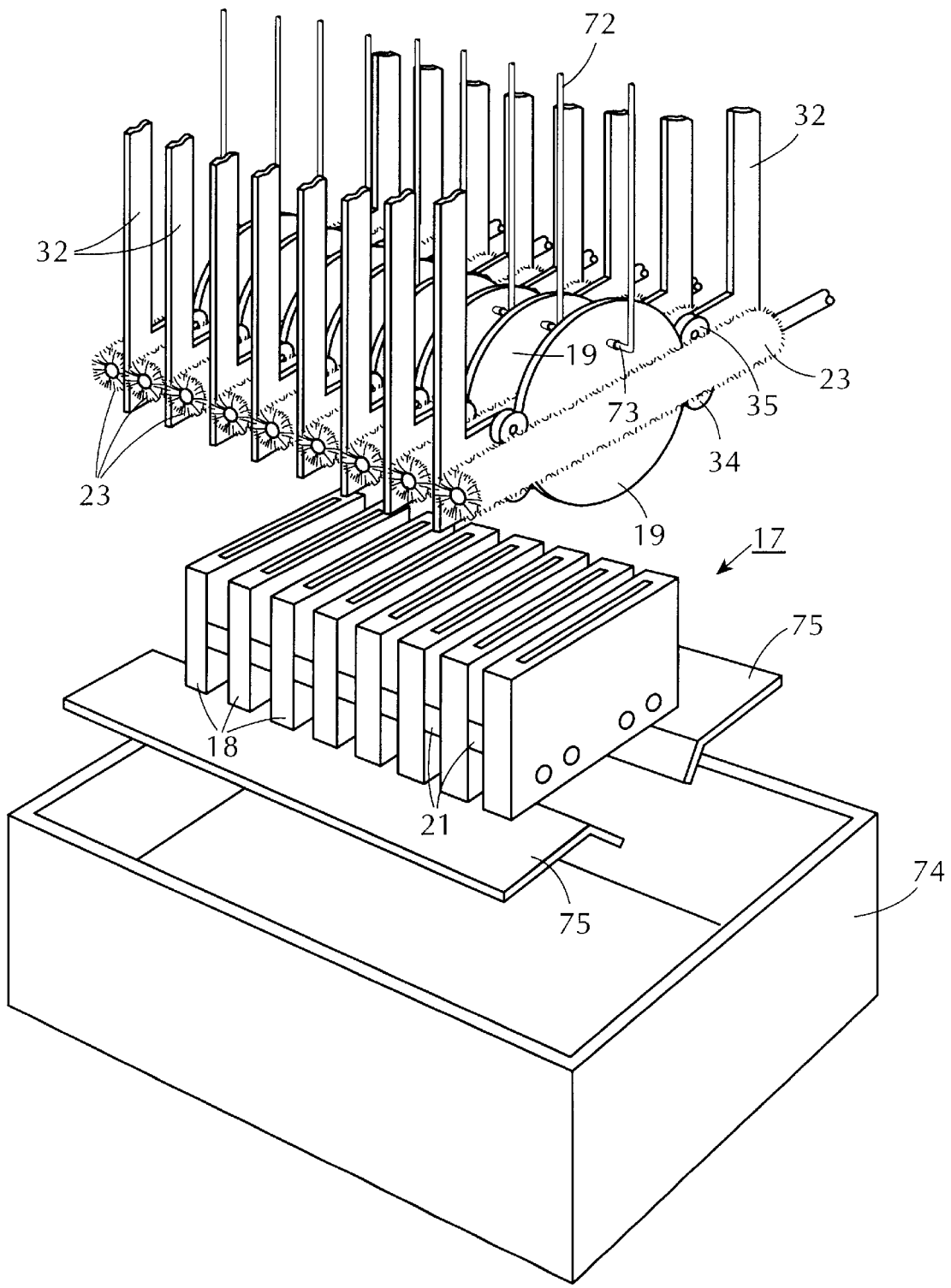
FIG. 4 illustrates a schematic perspective view of the scrubbing station of FIG. 3 with wafers in place between the brushes in accordance with the invention.

Thereafter, the arms 33 are raised into the position as shown in FIG. 4. During this time, the wafer 19 held by each pair of arms 33 is disposed between a pair of scrubbing brushes 23. Since the brushes 23 are rotating at this time, the opposite surfaces of the wafers 19 are being scrubbed.

Referring to FIG. 11, a mechanism 63 is also provided for rotating each wafer 19 which is held by a pair of arms 33. As shown, this mechanism 63 is mounted on a fixed horizontal track (not shown) to move rectilinearly and includes a motor 64 which is common to all of the pairs of arms 33. The motor 64, in turn, drives a sprocket 65 via a drive chain or belt 66. The sprocket 65, in turn, drives a drive shaft 67 via a suitable endless belt transmission (not shown) which is mounted on the end of a pair of support arms 68 extending from a bracket 69 of the mechanism 63. The drive shaft 67 is common to all the wafers 19 and serves to rotate all the wafers simultaneously.

The bracket 69 carries a plurality of guide rollers 70 which serve to guide the bracket along the fixed horizontal track (not shown) which is mounted on the frame of the machine. In addition, a pneumatic piston and cylinder 71 is connected to the bracket 69 in order to move the bracket 50 and, thus, the mechanism 63 rectilinearly from a position below and out of the path of a wafer 19 (not shown) into an extended horizontal position as shown in FIG. 11 wherein the drive shaft 67 is in contact with the wafers 19.

The mechanism 63 is also adjustable in a vertical plane to adapt to the size of the wafers. To this end, the track (not shown) on which the bracket 69 is mounted is, in turn, slidably mounted along a vertical track (not shown) secured in the machine frame. A separate piston and cylinder arrangement may also be provided for vertical movement of the mechanism 63.

For purposes of illustration, the drive shaft 67 is shown in FIG. 11 in contact with an 8" wafer while the arms 33 are shown holding a 6 inch wafer.

After the wafers 19 have been raised to the scrubbing position shown in FIG. 4, the arms 68 which carry the drive shaft 67 are extended into position so that the drive shaft 67 contacts the several wafers 19, for example at a six o'clock position and causes the wafers 19 to rotate, for example in a clockwise position as shown in FIGS. 4 and 11. Because each wafer 19 is thus rotated, the entire area of the two surfaces of the wafer 19 are exposed to the scrubbing brushes 23 and cleaned. Further, as the wheels 35 are spring loaded, the wheels 35 provide a downward force on the wafers 19 to keep the wafers 19 in contact with the drive shaft 67.

Referring to FIG. 3, the scrubbing station 12 also includes a plurality of pipes 72 which have either a single jet nozzle 73 or a double set of nozzles 73 for expelling water or other suitable cleaning agent against the rotating surfaces of a wafer as indicated in FIG. 4. As shown in FIG. 4, the nozzles 73 are located above the brushes 23 and within the plane of the surfaces of the wafers 19. Alternatively, the pipes 72 and nozzles 73 may also be positioned above the plane of the wafer surfaces.

A catch basin 74 is disposed below the rollers 23 and transfer conveyor 31 to catch the used cleaning agent and debris scrubbed from the wafers 19. Guide plates 75 may be provided to guide the used cleaning agent into the catch basin 74.

Referring to FIG. 2, the scrubbing station 12 of the machine 10 also employs a second wafer holder network 76 at the delivery station end which is of identical construction to that of the first wafer holder network 17 at the receiving station end. Hence, like reference characters are used to indicate like parts as above. This network 76 serves to deliver the cleaned wafers 19 from the scrubbing station 12.

After cleaning, the arms 33 are lowered from the position of FIG. 4 into the position of FIG. 3 in order to deposit the clean wafers 19 into the holders 18 of the take-off network 76.

After the wafers 19 have been lowered into the holders 18 of the holder network 76 of the delivery station, the holders 18 are moved from an expanded position under the brushes 23 to a retracted position by moving the rearmost holder towards the delivery end of the machine.

Referring to FIG. 10, each holder 18 of a holder network assembly 17, 76 is of three-part construction, namely a main body part 77, a mounting part 78 and a wafer holding part 79.

The main body 77 of the holder 18 is made of metal, for example, aluminum, and is of generally block shape. The bottom of the main body 77 is outwardly flanged and has a bore 80 for receiving an outrigger pin 22 (not shown) asymmetrically therein. The main body 77 also has one or more slotted openings (not shown) to accommodate the outrigger pins 22 of other holders 18.

The mounting part 78 is secured to the underside of the main body 77 via bolts or screws 81. As illustrated, the mounting part 78 has a substantially U-shaped cross-section and carries a plurality of T-shaped bearing pads 82 for sliding along the rail 20. As shown, a pair of bearing pads 82 are secured to the underside of the mounting part 78 while a single bearing pad 82 is secured to each side. Each bearing pad 82 is secured as by a bolt 84 to the mounting part 78 and each has a stem that slides within a groove in the rail 20.

The mounting part 78 also has a pair of plates 85 secured as by bolts 86 to the outside surfaces for holding the ends of the links 21 (not shown) in place.

The wafer holder part is removably mounted on the main body 77 by a mounting pin 87 and is made of two plastic pieces which are made to snap together. When placed together, the two pieces define a recess 88, for example of a width of 0.0394 inches, for receiving a wafer. In addition, the recess 88 is such that a minor portion of a wafer 19 is received so that the wafer 19 can be held in an upright position.

As shown, a wing-like projection 89 is secured as by a screw 90 to only one side of the main body part 77 to function as guides for correcting any small misalignment with the arms 33 when the wafers are being placed into the holders 18. The wing-like projection 89 is sized to fit within the chamfered groove of the depending guide piece 36 on a depending arm 33 (see FIG. 11).

Figure 8:
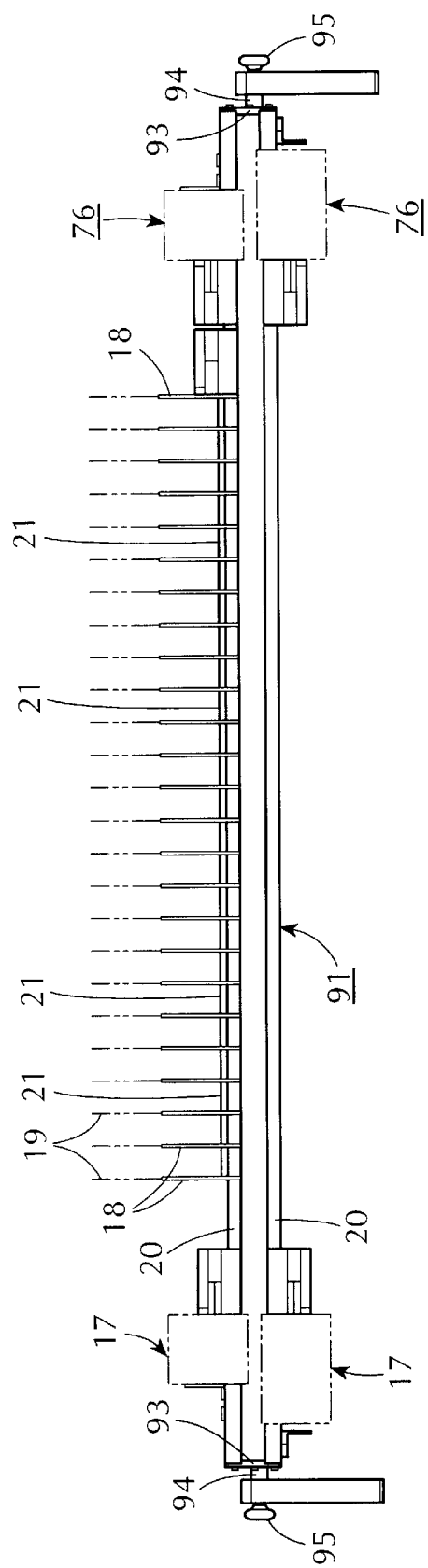
FIG. 8 illustrates a schematic view of a rotatable assembly employing two sets of wafer holder networks for different sized wafers in accordance with the invention.

Referring to FIG. 9, wherein like reference characters indicate like parts as above, two sets of wafer holder networks 17, 76, one for a small sized wafer, can be another for a larger sized wafer are incorporated in a single rotatable assembly 91. In this embodiment, the rotatable assembly 91 comprises a pair of longitudinal rails 20 which are disposed in parallel to and about a common longitudinal axis of rotation 92 and which are mounted on a plate 93 at each end. Each plate 93, is in turn secured to a stub shaft 74 (see FIG. 8) which is rotatably mounted in a bearing in the frame of the machine. Each stub shaft 94 also carries a handle 95 which is used to rotate the stub shaft 94 and thus the assembly 91 as desired. Brackets (not shown) are attached to the machine frame to captivate the plate 93 in the appropriate position.

The wafer holding parts 18 for each set of network 17, 76 are sized to receive a different diameter wafer from the other set of networks. For example, the upper set of networks as shown in FIG. 9 is sized to receive 12 inch wafers while the wafer holding parts of the depending holders of the other set of networks are sized to receive wafers of 8 inch diameter.

Figure 13:
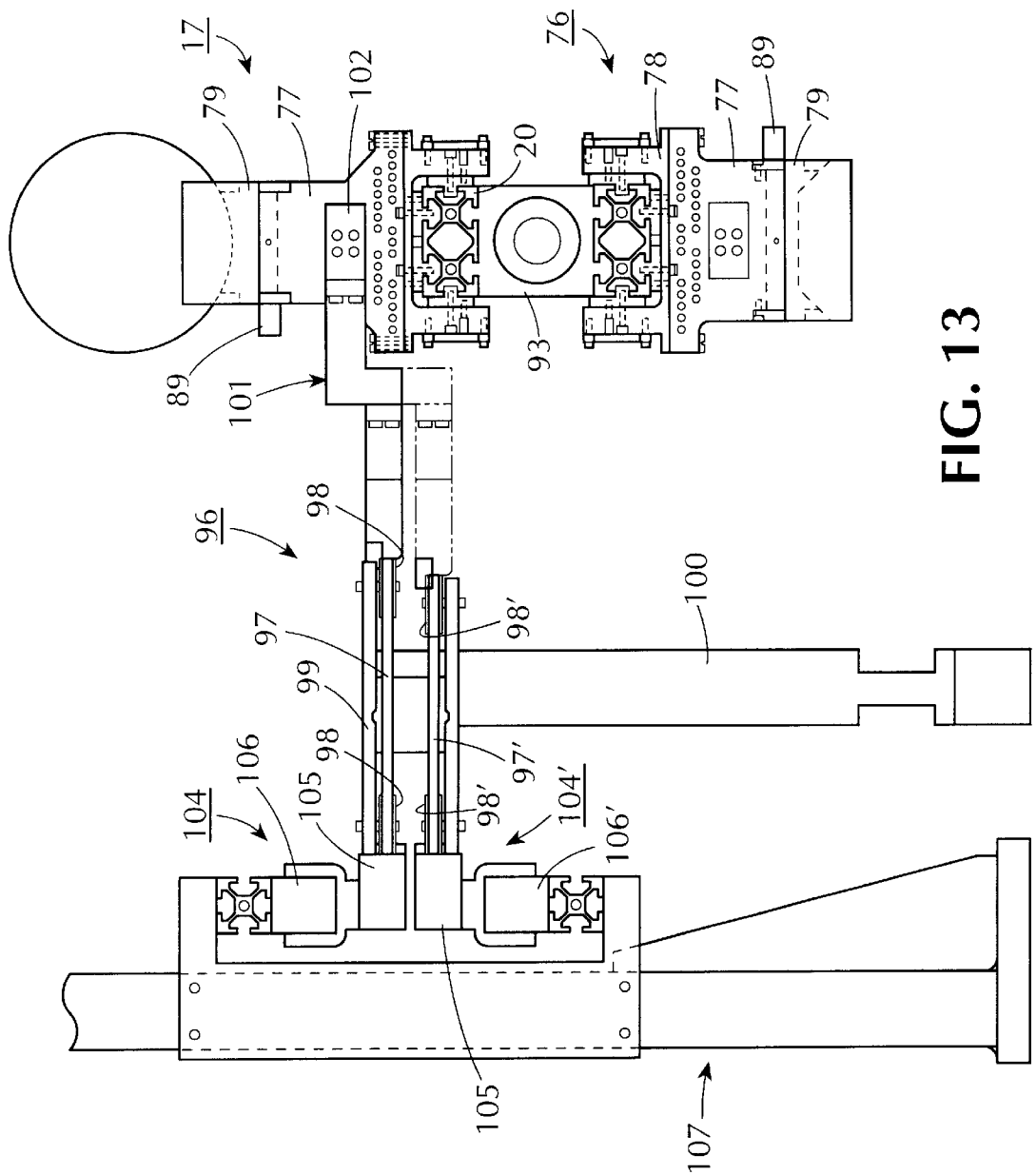
FIG. 13 illustrates a side view of an actuator system for driving the wafer holders of the machine.
Figure 14:
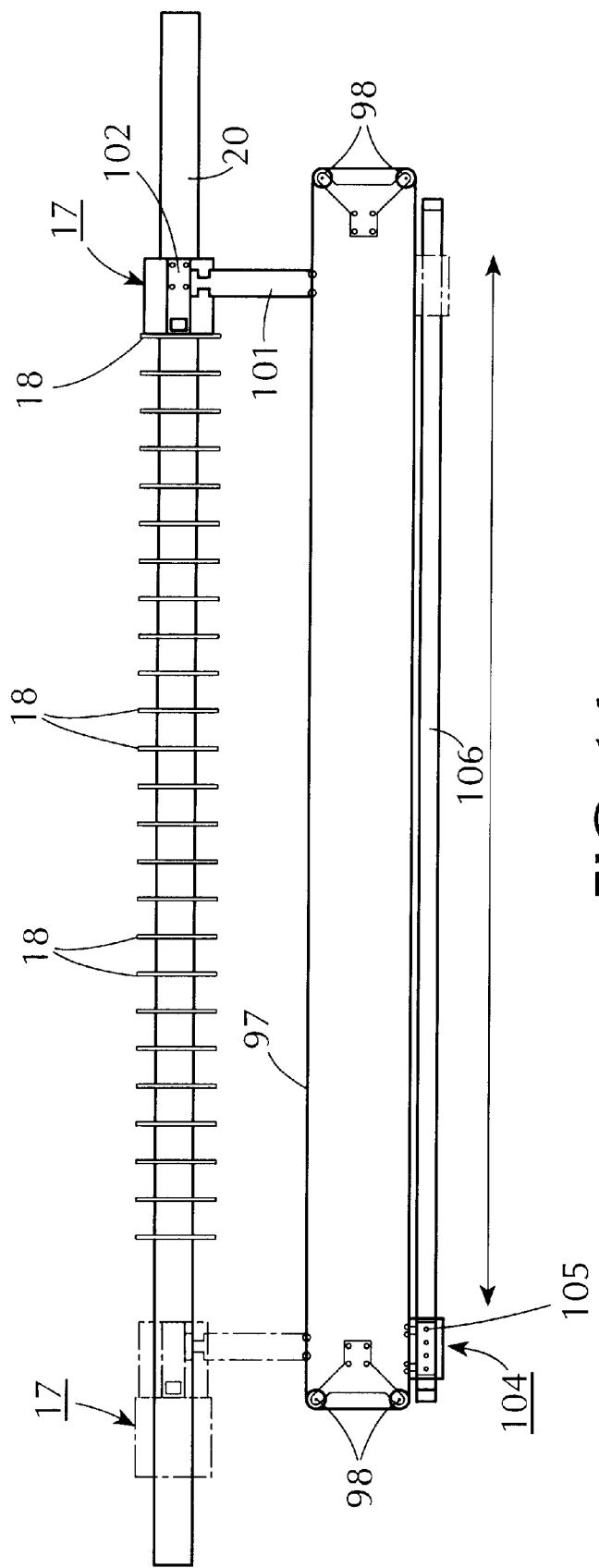
FIG. 14 illustrates a top view of the actuator system for one of said wafer holders.

Referring to FIG. 13, the actuator assembly 96 for affecting the movement of the holders of the "send" holder network 17 as well as the holders of the "receive" network 76 (not shown) includes a pair of endless cables 97, 97' which are disposed in parallel relation to each other as well as in parallel relation to the longitudinal rails 20 on which the respective networks 17, 76 are mounted. The upper cable 97 is looped about four pulleys 98, as indicated in FIG. 14, to define a rectangular shape. The lower cable 97' (not shown) is looped around four pulleys 98' and is mounted in a similar fashion.

As indicated in FIG. 13, the pulleys 98, 98' are mounted on respective plates 99, 99' which, in turn, are secured to an upstanding support 100 in any suitable fashion.

A pair of brackets 101, 101' are also incorporated in the actuator assembly 96. As indicated in solid line, the upper bracket 101 is secured to and between the upper cable 97 and the foremost holder 18 of the "send" network 17. For example, the bracket 101 is secured to the foremost holder 18 by a second bracket 102 which is mounted on a linear bearing assembly 103 (shown only in FIG. 14) which facilitates travel of the foremost holder 17 on a rail 20 and a suitable set of bolts. The opposite end of the bracket 101 is secured in suitable fashion to the cable 97 so as to be driven thereby.

The lowermost bracket 101', shown in phantom for purposes of simplicity, is connected to the foremost holder of the "receive" network 76 (not shown) in a similar fashion.

The actuator assembly 96 also employs a pair of rodless pneumatic actuator units 104, 104' of generally known construction. The upper pneumatic actuator unit 104 is connected to the upper cable 97 for driving this cable about the respective pulleys 98. In a similar fashion, the lower pneumatic unit actuator 104' is connected to the lower cable 97' to drive this cable about the pulleys 98'.

Referring to FIG. 14, the pneumatic actuator unit 104 is connected to the cable 97 at one end of one run of the cable 97 whereas the bracket 101 is connected to the opposite run of the cable 97 in a symmetrically opposite position.

As shown in FIG. 13, the upper pneumatic actuator unit 104 includes a piston carrier block 105 which is slidably mounted on a fixed rail portion 106 of the actuator unit 104 to move parallel to the cable 97 and the rails 20 of the holder network 17. In addition, the piston carrier block 105 is connected directly to the cable 97.

Both actuator units 104, 104' are supported in a suitable manner on a vertical mount 107.

When the upper pneumatic actuator unit 104 is in operation, the piston carrier block 105 slides along the track 106. Thus, as indicated in FIG. 14, the piston carrier block 105 moves from the solid line position to the dotted line position at the right-hand end of the cable 97. At the same time, the bracket 101 moves from the solid line position illustrated to the dotted line position. This, in turn, causes the foremost wafer holder 18 to move from the expanded position of the "send" holder network to the retracted position shown in dotted line.

The lower actuator unit 104' is connected to the lower cable 97' to effect a similar movement of the foremost holder of the "receive" network 76 (not shown). The positioning of the brackets 101, 101' on the respective cables 97, 97' are such that as the "send" network 17 is moving from the expanded position shown in FIG. 14 to the retracted position shown in dotted line, the holders of the "receive" network are moving from a retracted position to the expanded position. Thus, the two cables 97, 97' are moved in unison with each other so that as one wafer network is retracting, the other is expanding and vice versa.

Referring to FIG. 13, the actuator assembly 96 for affecting the movement of the holders of the "send" holder network 17 as well as the holders of the "receive" network 76 (not shown) includes a pair of endless cables 97, 97' which are disposed in parallel relation to each other as well as in parallel relation to the longitudinal rails 20 on which the respective networks 17, 76 are mounted. Each cable 97 is looped about four pulleys 98, 98', respectively, as indicated in FIG. 14, to define a rectangular shape. The lower cable (not shown) is mounted in a similar fashion.

As indicated in FIG. 13, the pulleys 98, 98' are mounted on respective plates 99, 99' which, in turn, are secured to an upstanding support 100 in any suitable fashion.

A pair of brackets 101, 101' are also incorporated in the actuator assembly 96. As indicated in solid line, the upper bracket 101 is secured to and between the upper cable 97 and the foremost holder 18 of the "send" network 17. For example, the bracket 101 is secured to the foremost holder 18 by a second bracket 102 and a linear bearing assembly 103 (shown only in FIG. 14) which facilitates travel of the foremost holder 17 on a rail 20 and a suitable set of bolts. The opposite end of the bracket 101 is secured in suitable fashion to the cable 97 so as to be driven thereby.

The lowermost bracket 101', shown in phantom for purposes of simplicity, is connected to the foremost holder of the "receive" network 76 (not shown) in a similar fashion.

The actuator assembly 96 also employs a pair of rodless pneumatic actuators 104, 104'. The upper pneumatic actuator 104 is connected to the upper cable 97 for driving this cable about the respective pulleys 98. In a similar fashion, the lower pneumatic actuator 104' is connected to the lower cable 97' to drive this cable about the pulleys 98'.

Referring to FIG. 14, the pneumatic actuator 104 is connected to the cable 97 at one end of one run of the cable 97 whereas the bracket 101 is connected to the opposite run of the cable 97 at the opposite end.

As shown in FIG. 13, the upper pneumatic actuator 104 includes a piston 105 which is slidably mounted on a fixed rail or track 106 to move parallel to the cable 97 and the rails 20 of the holder network 17. In addition, the piston 105 is connected directly to the cable 97.

Both actuators 104, 105 are supported in a suitable manner on a vertical mount 107.

When the upper pneumatic actuator 104 is in operation, the piston 105 slides along the track 106. Thus, as indicated in FIG. 14, the piston 105 moves from the solid line position to the dotted line position at the right-hand end of the cable 97. At the same time, the bracket 101 moves from the solid line position illustrated to the dotted line position. This, in turn, causes the foremost wafer holder 18 to move from the expanded position of the "send" holder network to the retracted position shown in dotted line.

The lower actuator 104 is connected to the lower cable 97' to effect a similar movement of the foremost holder of the "receive" network 76 (not shown). The positioning of the brackets 101, 101' on the respective cables 97, 97' are such that as the "send" network 17 is moving from the expanded position shown in FIG. 14 to the retracted position shown in dotted line, the holders of the "receive" network are moving from a retracted position to the expanded position. Thus, the two cables 97, 97' are moved in unison with each other so that as one wafer network is retracting, the other is expanding and vice versa.

Referring to FIG. 1, the delivery station 13 includes a wafer transfer module 96 and a carousel module 97 which has tiers of peripheral openings to accommodate four or more annular rows of wafer holding cassettes.

The carousel module 15 in the receiving station 11 and the carousel module 97 in the delivery station 13 are of similar construction. Each carousel module 14, 97 carries a plurality of cassettes of conventional structure and need not be further described.

The wafer transfer module 15 in the receiving station 11 is constructed in a manner so as to transfer the wafers in a cassette on the carousel module 15 into a position above the holder network 17 for depositing into the individual holders 18 and while doing so to move the wafers from a horizontal disposition into a vertical disposition for depositing into the holders 18.

The wafer transfer module 96 in the delivery station 13 is constructed to move the cleaned wafers from the wafer holder network 76 from a vertical disposition into horizontal positions within a cassette of the carousel module 97.

The details of the wafer transfer modules 15, 96 are not required for an understanding of the operation of the scrubbing station 12 as any suitable type of transfer mechanism may be employed to deliver and remove wafers to and from the scrubbing station 12.

In order to use the machine, the rotatable assembly 91 is rotated into a position appropriate to the wafer size to be processed. Thereafter, a cassette of wafers is delivered to the receiving station 11 and the wafers 19 deposited into the wafer holding parts 79 of each holder 18. In this respect, the network 17 may have a larger number of holders 18 than the actual number of holders 18 of wafers in a cassette. This allows the holder network 17 to accommodate cassettes with different numbers of wafers. In any event, the wafers are delivered to the foremost holders of the network 17.

Thereafter, the holders 18 are moved into the expanded condition by actuating the lead screw or pneumatic piston for driving the foremost holder. As the foremost holder moves away from the receiving station 11 to a position in the scrubbing station 12 under the brushes 23, the flexible links 21 between the holders 18 allow the foremost holder to pull the trailing holders forwardly. At this time, the various holders 18 serve to guide the remaining holders via the pins 22.

After the holders have reached position under the scrubbing brushes 23, as indicated in FIG. 3, the arms 33 of the transfer conveyor 31 are lowered into alignment with the respective wafers. The arms 33 are then operated in unison by the spreader assembly 53 so as to engage each wafer 19 via the fixed guides 34 and rotatable wheels 35. Thereafter, the engaged wafers are moved upwardly out of the holders 18 and into and between a pair of rotating brushes 23 (FIG. 4) by the lifting unit 32.

At this time, the holders 18 of the network 17 are retracted into the retracted position in order to receive a supply of wafers from a subsequently delivered cassette.

During a scrubbing operation, suitable scrubbing agent is delivered via the pipes and nozzles 73 in order to clean the opposite surfaces of the wafers 19. At the same time, drive shaft 67 is extended into position to engage the respective wafers 19 to cause rotation. In this way, complete cleaning of the surfaces of each wafer 19 can be performed.

After scrubbing, the lifting units 32 are lowered into the position shown in FIG. 3. Prior to this time, the holder network 76 at the delivery station end has been moved into the expanded position so as to receive the wafers 19 from the transfer conveyor 31. After the wafers have been deposited into the wafer holding parts of the respective holders, the arms 33 are expanded relative to each other via the spreader assembly 53 and moved away from the holders. The holders 18 of the second holder network 76 are then retracted into the retracted position at the delivery station end of the scrubbing station.

Once the cleaned wafers have arrived in the delivery station 13, the wafers 19 are loaded into an empty cassette for subsequent transfer to the carousel module 97.

The scrubbing machine may operate in a stand-alone fashion or may be coupled to other machines. For example, the scrubbing machine may be coupled to a wafer cleaning and demounting machine. In this respect, the cleaning and demounting machine would be modified so that the wafers are delivered directly into a cassette in a vertically upstanding manner and the cassette delivered to the scrubbing machine. The wafers would then be transferred from the delivery cassette directly into the holders of the wafer holding network as described above.

The invention thus provides a machine which is able to scrub a plurality of wafers simultaneously.

The invention further provides a scrubbing machine which is capable of high output.

The invention further provides a scrubbing machine which covers a limited surface area thereby providing a small footprint.

The invention further a wafer scrubbing machine which can be readily adapted to receive wafers of different sizes from cassette to cassette.

What is claimed is:

1. A wafer scrubbing machine comprising
a first wafer holder network including a plurality of holders, each holder being disposed to receive a wafer in a vertically upstanding manner and an actuator system for moving said holders relative to each other between a retracted first position with said holders adjacent each other and an expanded second position with said holders in spaced apart relation to each other;

a plurality of parallel rotatably mounted brushes; and a transfer conveyor for simultaneously moving a plurality of wafers from said holders in said second position thereof into and between said brushes for scrubbing of each wafer between a pair of adjacent brushes.

2. A wafer scrubbing machine as set forth in claim 1 further comprising a second wafer holder network including a plurality of holders and means for moving said holders relative to each other between an expanded position with said holders in spaced apart relation to each other to receive a plurality of wafers from said transfer conveyor and a retracted position with said holders adjacent each other.

3. A wafer scrubbing machine as set forth in claim 2 which further comprises a receiving station for receiving a cassette of wafers and for transferring the wafers in a cassette into said holders of said first wafer holder network and a delivery station for transferring the scrubbed wafers into a cassette, said delivery system being adjacent to said second wafer holder network when said wafer holder network is in said retracted position.

4. A wafer scrubbing machine as set forth in claim 1 wherein said transfer conveyor includes a plurality of pairs of depending arms for movement between a respective pair of said brushes, a guide on a lower end on each arm for engaging a peripheral edge of a wafer mounted on a respective holder, a rotatable wheel mounted intermediately of each arm for engaging the peripheral edge of a wafer and a spreader assembly for moving at least one of said arms relative to the other of said arms to selectively engage each said guide and said wheel with a respective wafer.

5. A wafer scrubbing machine as set forth in claim 4 which further includes means for rotating an engaged wafer during passage between a respective pair of said brushes.

6. A wafer scrubbing machine as set forth in claim 1 wherein said holders are disposed on a pitch of 10 millimeters in said retracted position.

7. A wafer scrubbing machine as set forth in claim 1 which further comprises a catch basin below said brushes thereof to receive used cleaning fluid.

8. A wafer scrubbing machine as set forth in claim 1 wherein said actuator system for moving said holders is connected to a foremost holder of said holders for moving said foremost holder between said positions of said holders and includes a plurality of longitudinally collapsible links connected to and between each pair of adjacent holders to transfer a forward motion therebetween.

9. A wafer scrubbing machine as set forth in claim 8 which further comprises a plurality of guide pins, each pin being secured to a selected one of said holders and passing through a plurality of said holders for guiding said holders relative to each other.

10. A wafer scrubbing machine as set forth in claim 1 wherein each holder has an arcuate recess in a top surface thereof to receive a wafer in upstanding relation.

11. A wafer scrubbing machine as set forth in claim 10 wherein each recess has a width of 0.0394 inches.

12. A wafer scrubbing system as set forth in claim 1 wherein said actuator system includes an endless cable extending parallel to a path of a foremost one of said holders between said retracted position and said expanded position, a bracket secured to and between said cable and a foremost one of said holders, and a pneumatic actuator connected to said cable for driving said cable to effect movement of said bracket and said foremost holder between positions of said holders.

13. A wafer scrubbing assembly comprising a wafer holder network including a plurality of holders for receiving wafers in a vertically upstanding manner and being movable relative to each other between a retracted position with said holders adjacent each other and an expanded position with said holders in spaced apart relation to each other;

a plurality of parallel rotatably mounted brushes disposed above said holders when said holders are in said expanded position thereof; and a transfer conveyor for simultaneously moving a plurality of wafers vertically between said holders in said expanded position thereof and said brushes.

14. A wafer scrubbing machine as set forth in claim 13 wherein said transfer conveyor includes a plurality of pairs of depending arms for movement between a respective pair of said brushes, at least one of said arms being movable laterally relative to the other arm of said pair of arms, a guide on a lower end of each arm for engaging a peripheral edge of a wafer mounted on a respective holder and a rotatable wheel mounted intermediately of each arm for engaging the peripheral edge of a wafer.

15. A wafer scrubbing machine as set forth in claim 14 which further includes a rotatable drive shaft for rotating a plurality of engaged wafers simultaneously during passage between a respective pair of said brushes.

16. A wafer scrubbing machine as set forth in claim 15 further comprising a spring biasing a respective wheel against a wafer received between said arms to bias the wafer against said drive shaft.

17. A wafer scrubbing machine as set forth in claim 14 wherein each holder includes a projection and wherein each pair of arms includes at least one depending guide piece having a groove therein for receiving said projection to align said pair of arms with a respective holder during transfer of a wafer therebetween.

18. A wafer scrubbing machine as set forth in claim 13 wherein each holder includes a main body part of metal and a wafer holding part of plastic removably mounted on said main body part, said wafer holding part defining a recess therebetween for receiving a minor portion of a wafer.

19. A wafer scrubbing station as set forth in claim 13 which further comprises an actuator system for driving a foremost one of said holders between said retracted position and said expanded position, said actuator system including an endless cable extending parallel to a path of a foremost one of said holders between said retracted position and said expanded position, a bracket secured to and between said cable and the foremost holder, and a pneumatic actuator connected to said cable for driving said cable to effect movement of said bracket and said foremost holder between said positions of said holders.

20. A wafer scrubbing machine comprising a receiving station for receiving a cassette of wafers;

a scrubbing station including a first wafer holder network including a plurality of holders, each holder being disposed to receive a wafer in a vertically upstanding manner, means for moving said holders relative to each other between a retracted position at said receiving station with said holders adjacent each other and an expanded position with said holders in spaced apart relation to each other, a plurality of parallel rotatably mounted brushes above said holders when said holders are in said expanded position thereof, a transfer conveyor for simultaneously moving a plurality of wafers from said holders in said expanded position thereof into and between said brushes for scrubbing of each wafer between a pair of adjacent brushes, and a second wafer holder network including a plurality of second holders and an actuator system for moving said second holders relative to each other between an expanded position with said second holders in spaced apart relation to each other to receive a plurality of wafers from said transfer conveyor and a retracted position with said second holders adjacent each other; and a delivery station for delivering wafers from said second wafer holder network to a cassette, said delivery station being adjacent to said second wafer holder network when said second wafer holder network is in said retracted position.

21. A wafer scrubbing machine as set forth in claim 20 wherein said transfer conveyor includes a plurality of pairs of depending arms for movement between a respective pair of said brushes, at least one of said arms of each pair of arms being movable laterally relative to the other of said arms of said pair of arms, a guide on a lower end on each arm for engaging a peripheral edge of a wafer mounted on a respective holder and a rotatable wheel mounted intermediately of each arm for engaging the peripheral edge of a wafer.

22. A wafer scrubbing machine as set forth in claim 21 which further includes a rotatable drive shaft for rotating a plurality of engaged wafers simultaneously during passage between a respective pair of said brushes.

23. A wafer scrubbing machine as set forth in claim 20 which further comprises a catch basin below said brushes to receive used cleaning fluid.

* * * * *